US006271503B1

(12) United States Patent
Hall et al.

(10) Patent No.: US 6,271,503 B1
(45) Date of Patent: Aug. 7, 2001

(54) DIMENSIONAL COMPENSATING VACUUM FIXTURE

(75) Inventors: Richard Ronald Hall, Endwell, NY (US); Francesco Marconi, Hallstead, PA (US); Peter Michael Nichols, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/559,846

(22) Filed: Apr. 27, 2000

(51) Int. Cl.[7] .............................. H05B 3/68; C23C 16/00; B25B 11/00

(52) U.S. Cl. .......................... 219/444.1; 118/724; 269/21

(58) Field of Search ................................ 219/444.1, 534, 219/538, 540; 118/723 VE, 724, 725, 728, 729, 732; 165/80.2, 80.3, 80.4, 80.5; 269/21

(56) References Cited

U.S. PATENT DOCUMENTS

| | | | | |
|---|---|---|---|---|
| 4,521,995 | * | 6/1985 | Sekiya | 451/388 |
| 4,597,228 | * | 7/1986 | Koyama et al. | 451/388 |
| 5,141,212 | * | 8/1992 | Beeding | 269/21 |
| 5,199,483 | * | 4/1993 | Bahng | 165/80.1 |
| 5,343,012 | * | 8/1994 | Hardy et al. | 118/725 |
| 5,417,408 | * | 5/1995 | Ueda | 269/21 |
| 5,667,128 | * | 9/1997 | Rohde et al. | 228/49.5 |
| 5,738,165 | * | 4/1998 | Imai | 165/80.2 |
| 5,883,932 | * | 3/1999 | Chiba et al. | 378/34 |
| 5,885,353 | * | 3/1999 | Strodtbeck et al. | 118/712 |
| 5,899,445 | * | 5/1999 | Kimble | 269/21 |

* cited by examiner

*Primary Examiner*—Sang Paik
(74) *Attorney, Agent, or Firm*—Scully, Scott, Murphy & Presser; William E. Schiesser, Esq.

(57) ABSTRACT

A vacuum fixture incorporating a vacuum suctioning device which may be employed in the manufacture of thin film chip carriers through the intermediary of retaining parts which are to be processed on the surface of a suction plate in a dimensionally compensating operative mode. A process is disclosed which may be employed in the manufacture of thin film chip carriers which is adhered in a dimensionally compensating manner to the surface of an interposer plate which is supported on a suction plate of a vacuum fixture.

8 Claims, 1 Drawing Sheet

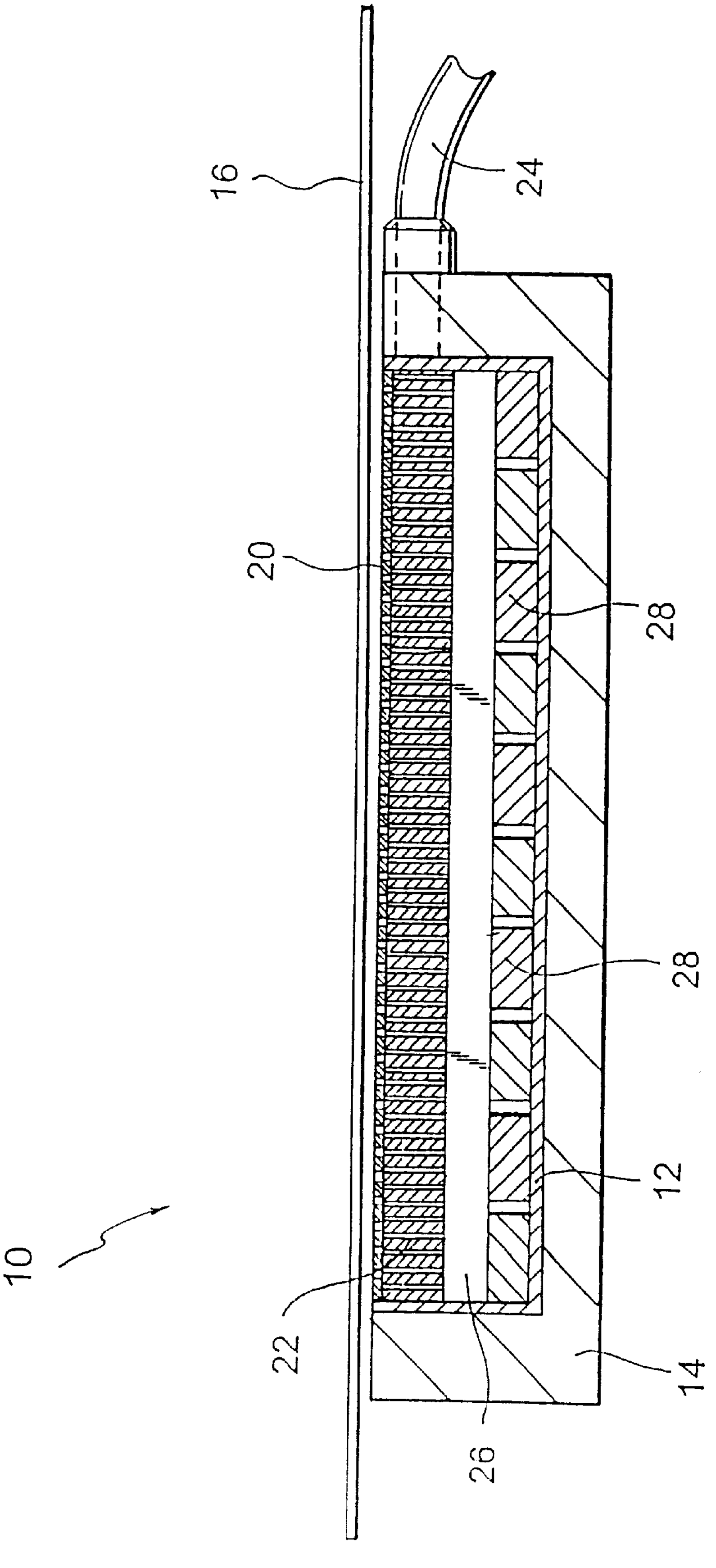
16
24
20
28
28
12
10
22
14
26

DIMENSIONAL COMPENSATING VACUUM FIXTURE

CROSS-REFERENCES TO RELATED APPLICATIONS

U.S. Ser. No. 09/233,838; filed on Jan. 20, 1999.

BACKGROUND OF THE INVENTION

1. Field of the Invention

The present invention relates to a vacuum fixture incorporating a vacuum suctioning device which may be employed in the manufacture of preferably thin film chip carriers through the intermediary of retaining parts which are to be processed on the surface of a suction plate in a dimensionally compensating operative mode. Moreover, the invention is directed to a process which may be employed in the manufacture of preferably thin film chip carriers which is adhered in a dimensionally compensating manner to the surface of an interposer plate which is supported on a suction plate of a vacuum fixture.

The utilization of vacuum suction devices for the retention components such as workpieces or webs through the intermediary of applying a suctioning force or a vacuum the components which are to be processed, while positioned on a surface, such as while being ground or treated; for instance, semiconductor wafers or the like, is well-known in the technology. In essence, a glass plate which may have apertures of via holes provided therein is positioned on a porous plate, which is constituted of a suitable rigid material, and a vacuum is then applied thereto for retaining the workpieces on the glass plate wherein the vias in the glass plate enable the suctioning effect created by the vacuum to be imparted to the workpieces.

A previous process which was employed in the manufacture of thin film chip carriers resided in the punching of via holes in a continuous polyimide web. Subsequent processes required two high-temperature operations; in effect, sputtering copper and laminating photoresist on the web, prior to exposing circuitry present on the perforated web. The high temperatures created dimensional inconsistencies or distortions in the spacings of the holes in the web, such spacing between the holes generally being employed to orient a glass master utilized for the purpose of exposing a circuit pattern on the polyimide web. Heretofore, one approach which has been employed in order to be able to correct this problem has been through the use of glass masters for circuitry provided with dimensionally compensated artwork to offset terminal distortions caused by the high-temperature operations involved. However, the provision of glass master generation may readily entail expenditures of up to about $2,000.00 for each glass master. Inasmuch as a single thin film chip carrier production facility may require the provision of a few hundred glass masters in a thin film chip carrier production line, this can readily result in overall equipment costs of potentially hundreds of thousands of dollars.

2. Discussion of the Prior Art

Various types of vacuum devices and installations are currently known and employed in industry and in the technology for retaining workpieces or webs in position during various manufacturing processes.

Rohde, et al., U.S. Pat. No. 5,667,128 relates to a work station for processing a flexible membrane through the employment of a platform which supports and heats the flexible membrane during the processing cycle. The platform is equipped with a vacuum arrangement for retaining a workpiece in position, but does not provide for any dimensional compensating relative to the membrane.

Ueda, U.S. Pat. No. 5,417,408 discloses a wafer holding apparatus incorporating a plate member having through-extending bores which communicate with a vacuum source. The drawing of a vacuum is adapted to create a suction effect intended to retain a workpiece consisting of the wafer immobile against the perforated surface of the plate member so as to enable the wafer to be treated while inhibiting any movement relative to the wafer holding apparatus.

Hardy, et al., U.S. Pat. No. 5,343,012 discloses an arrangement for supporting a substrate on a heater block. The heater block is equipped with a vacuum-generating system adapted to be regulated so as to support the substrate on the heater block in a fixed position to facilitate temperature control over a thin film structure which is to be fabricated on the substrate.

Pending, U.S. Pat. No. 5,141,212 discloses a vacuum chuck having a foam surface structure which has a vacuum applied thereto for retaining a workpiece thereon in a fixed position clamped to a metal plate while being processed.

Koyama, et al., U.S. Pat. No. 4,597,228 discloses a porous material plate having a flat surface adapted to have a workpiece positioned thereon, and with a supporting structure for a vacuum suction plate adapted to impart a vacuum to a plurality of suction grooves to impart a retentive suctioning force to the workpiece.

Sekiya, U.S. Pat. No. 4,521,995 discloses a wafer attracting and fixing device, including a porous plate structure communicating with a vacuum source and wherein an upper plate has a workpiece adapted to be positioned thereon and retained in place due to the application of the suctioning effect of the vacuum. A water injecting hole may be employed for injecting water to soak the attracting surface, and wherein the surface tension of the water transfers the wafer constituting the workpiece to the center of the attracting surface, where it then retained by the vacuum.

Although the foregoing U.S. patents are each directed to respectively various types of vacuum apparatus and methods of positioning workpieces for processing; for example, such as wafers or thin film webs on a work or treating surface which is adapted to be in communication with a source of vacuum, there is no provision for compensating for dimensional distortions or inconsistencies and displacement of a hole or pattern spacing of the workpiece or a thin film web or chip carrier caused by high temperature processing cycles.

SUMMARY OF THE INVENTION

Accordingly, pursuant to the present invention, a workpiece constituted of a continuous thin film chip carrier or web; for example, which constituted of polyimide having via holes therein and which has a circuit pattern exposed by a blanket expose machine, is retained in a stationary or fixed position by the inventive vacuum fixture during the pattern exposure cycle. A perforated interposer structure in the form of a perforated plate having an upper surface forming the top surface of the vacuum fixture and which has the polyimide web located thereon, provides for thermal insulation in forming an insulator, as well as processing a thermal expansion rate or coefficient of thermal expansion which is equivalent to that of a porous sintered metal plate of the vacuum fixture, providing a support for the interposer structure. In effect, the interposer is adapted to insulate the thin film chip carrier or polyimide web from temperature rises and serves as an inexpensive and readily disposable component adapted to maintain product cleanliness within a clean or sterile room environment.

A vacuum generating device circulates suctioning air through the porous plate supporting the interposer structure, wherein the porous plate, selectively expands and contracts while a flow of air passes thereto creating the vacuum for retaining the polyimide web on the interposer structure. In order to regulate or essentially drive the expansion and contraction of the porous plate, individual bars which, respectively, extend in an X-direction and a Y-direction and which may also be vertically controllable in a Z-direction are arranged below the porous plate within the framework of the vacuum apparatus, wherein expansions and contractions of the bars due to thermal changes imparted thereto by a temperature controller, transferred to the porous plate, and the resultant displacements due to thermal changes conveyed to the web through the adherence of the vacuum fixture to the web. This will offset any dimensional inconsistencies or distortions in hole patterns in the web and provide for an accurate processing which is not subject to vagaries in the temperature conditions.

Accordingly, it is an object of the present invention to provide a novel vacuum fixture for supporting a workpiece under the effect of a vacuum or sub-atmospheric condition and which provides for a temperature control system of affording a high accuracy in positioning and dimensional compensation of inconsistencies encountered through temperature variations.

A further object of the invention resides in the provision of a vacuum fixture for supporting a workpiece such as a thin polyimide web, in fixed position on an interposer structure supported on a porous plate, which includes temperature control structure for controlling the expansion and contraction of the porous plate so as to compensate the dimensional inconsistencies in the web which may be encountered during high temperature operation, such control being afforded by bass which are expandable or contractable by means of thermal control, whereby the bars drive the expansion or contraction of the porous plate due to thermal conditions and transfer the thermally-induced displacements to the web.

Another object of the invention resides in the provision of a method employed in the manufacture of workpieces, such as a thin film chip carrier web, wherein the workpiece is positioned on a vacuum or suction fixture retaining the workpiece thereon, and which incorporates dimensional compensating structure for accurate positioning of the web during high temperature operations.

BRIEF DESCRIPTION OF THE DRAWINGS

Reference may now be had to the following detailed description of a preferred embodiment of the invention, taken in conjunction with the accompanying single FIGURE of drawing, generally diagrammatically illustrating a vacuum fixture for the dimensionally compensating retention of a workpiece thereon, such as a thin film chip carrier web.

DETAILED DESCRIPTION OF A PREFERRED EMBODIMENT

Referring in specific detail to the drawing FIGURE illustrating the inventive vacuum device 10, there is disclosed a vacuum fixture 12 which adheres in size to the overall area of the web frame 14. A continuous polyimide web 16, such as may be employed in the thin film chip carrier technology, having via holes, for example, each 8 mil in diameter, has a circuit pattern exposed thereon by means of a blanket exposed machine (not shown). The web 16 is retained stationarily in position by means of the vacuum fixture 12 during exposure under high temperature operation conditions, such as during sputtering copper and laminating photoresist on the web prior to exposing circuitry on the perforated web. This may lead to hole inconsistencies in the web.

The web 16 is positioned on an interposer plate 20 which is essentially a thin piece of perforated material which forms a thermal insulator, as well as being selected from a material possessing a coefficient of thermal expansion or rate of thermal expansion equivalent to that of a porous plate 22 on which it is supported. The porous plate 22 is preferably constituted of a sintered metal; for example, such as copper, steel, aluminum, or may be constituted of a suitable composite having a porous matrix which permits the passage of a flow of air thereto.

The interposer plate 20 on which the web 16 is supported and which rests on the porous plate 22 insulates the web thereon from any temperature rises, and also serves as a generally disposable and replaceable constituent of the vacuum fixture, so as to be able to maintain product cleanliness in a clean or sterile room environment during processing operations.

A vacuum inlet line or conduit 24 which is connected to a vacuum source (not shown) communicates with the porous plate 22, and is adapted to transmit the vacuum to the perforated insulating interposer plate 20 through the porous plate 22 so as to ensure the polyimide web 16 being fixedly positioned on the perforated insulating interposer plate 20.

During high temperature operation to which the web 16 is exposed the porous plate 22, which as indicated may be constituted of sintered metal or the like, either expands or contracts in response to changing thermal conditions while a path of vacuum air passes thereto through the formation of the vacuum which causes the web 16 to be retained on the insulating interposer plate 20. Arranged beneath to extend the porous sintered metal plate 22 are at least two sets of heater bars 26, 28 in superimposed relationship, although additional layers of heater bars may also be provided, and which are operatively and thermally connected to the porous plate 22. These bars 26, 28 are responsive to the thermal heating/cooling effects of a temperature control arrangement (not shown) so as to either expand or contract in correlation with temperature conditions required for the web 16, and thereby positively drive the porous plate 22 and to regulate the degree of expansion and contraction of the porous plate in the X and Y-directions and possibly also vertically in the Z-direction. By orienting the individual sets of bars 26, 28 to have one set thereof extending in the X-direction and the other set in the Y-direction beneath the porous plate 22 to which they are operatively connected, this will provide for the thermal control over the selective directional expansion or contraction of the porous plate 22. The thermally engengered displacements thereof due to thermal expansions is transmitted to the web 16 through the adherence thereof to the vacuum fixture 12 by means of the perforated interposer plate 20, thereby providing for compensating of any dimensional inconsistencies or distortions in web holes spacings, since the degree of thermal expansion will be correlated between the interposer plate 20 and the porous plate 22.

The foregoing vacuum fixture 12 with dimensional compensation structure resultingly eliminates the problems heretofore encountered during high temperature operations tending to cause dimensional inconsistencies in a workpiece, such as a thin film polyimide web used in the chip carrier technology, although other types of chip carriers can also be treated in this manner.

While there has been shown and described what is considered to be a preferred embodiment of the invention, it will, of source, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A method for retaining a workpiece on a surface of a vacuum fixture during processing of said workpiece while implementing dimensional compensation of distortions caused by thermal changes; said method comprising:

(a) providing a frame structure housing a rigid porous plate;

(b) connecting a vacuum line to a vacuum source communicating with said porous plate for creating a flow of suctioning air through said plate;

(c) supporting an apertured interposer member on said porous plate, said apertured interposer member comprising a thin plate member having a coefficient of thermal expansion generally equal to that of the porous plate, and forming a thermal insulator between the workpiece and the porous plate, said workpiece being positionable on a planar upper surface of said interposer member and retained thereon in surface contact by a vacuum created by said suctioning air; and (d) arranging heat-controllable structure below said porous plate in operative engagement therewith, whereby controlling the thermal conditions of said structure selectively expands or contacts said porous plate in correlation with thermal distortions of said workpiece so as to dimensionally compensate said workpiece to facilitate accurate processing thereof.

2. A method as claimed in claim 1, wherein said perforated interposer plate member is disposable and interchangeable with further perforated interposer plate members so as to maintain a clean processing environment for said workpiece.

3. A method as claimed in claim 1, wherein said heat-controllable structure comprises a plurality of bars which are expandable and contractable responsive to thermal control means and communicate the expansions and contractions thereof to said porous plate.

4. A method as claimed in claim 3, wherein said plurality of bars are arranged in at least two superimposed layers.

5. A method as claimed in claim 4, wherein said layers of bars are expandable and contractable in, respectively, X- and Y- and Z-directions to facilitate selective displacement of said porous plane in said porous plate in fixture at different rates in different horizontal and vertical directions.

6. A method as claimed in claim 1, wherein said porous plate consists of a sintered material selected from the group of metals consisting of copper, steel, aluminum, or of a composite material having a porous matrix.

7. A method as claimed in claim 1, wherein said workpiece comprises a thin film chip carrier.

8. A method as claimed in claim 7, wherein said thin film chip carrier comprises a polyimide web.

* * * * *

UNITED STATES PATENT AND TRADEMARK OFFICE

CERTIFICATE OF CORRECTION

PATENT NO. : 6,271,503 B1 Page 1 of 1
DATED : August 8, 2001
INVENTOR(S) : R. Hall et al.

It is certified that error appears in the above-identified patent and that said Letters Patent is hereby corrected as shown below:

<u>Title page,</u>
Insert -- [62] Division of application No. 09/233,838. January 20, 1999. --

<u>Column 2,</u>
Line 16, "Pending" should read -- Beeding --

<u>Column 5,</u>
Line 3, "of source" should read -- of course --

Signed and Sealed this

Twenty-fourth Day of September, 2002

*Attest:*

JAMES E. ROGAN

*Attesting Officer* *Director of the United States Patent and Trademark Office*